United States Patent
Kao et al.

(10) Patent No.: US 11,973,047 B2
(45) Date of Patent: Apr. 30, 2024

(54) ELECTRONIC PACKAGE INCLUDING ELECTRONIC STRUCTURE AND ELECTRONIC COMPONENT

(71) Applicant: SILICONWARE PRECISION INDUSTRIES CO., LTD., Taichung (TW)

(72) Inventors: Feng Kao, Taichung (TW); Lung-Yuan Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 17/102,841

(22) Filed: Nov. 24, 2020

(65) Prior Publication Data
US 2022/0068867 A1 Mar. 3, 2022

(30) Foreign Application Priority Data
Sep. 2, 2020 (TW) .................... 109130061

(51) Int. Cl.
*H01L 23/31* (2006.01)
*H01L 21/56* (2006.01)
*H01L 23/00* (2006.01)

(52) U.S. Cl.
CPC .............. *H01L 24/17* (2013.01); *H01L 21/56* (2013.01); *H01L 23/3157* (2013.01); *H01L 24/13* (2013.01); *H01L 24/16* (2013.01); *H01L 24/24* (2013.01); *H01L 24/73* (2013.01); *H01L 24/81* (2013.01); *H01L 24/92* (2013.01); *H01L 2224/13005* (2013.01); *H01L 2224/13083* (2013.01); *H01L 2224/16145* (2013.01); *H01L 2224/16225* (2013.01); *H01L 2224/1703* (2013.01); *H01L 2224/24227* (2013.01); *H01L 2224/73209* (2013.01); *H01L 2224/92124* (2013.01)

(58) Field of Classification Search
CPC . H01L 2224/13005; H01L 2224/13083; H01L 2224/16145; H01L 2224/16225; H01L 2224/1703; H01L 2224/24227; H01L 2224/73209; H01L 2224/92124; H01L 21/56; H01L 23/3157; H01L 24/13; H01L 24/16; H01L 24/24; H01L 24/73; H01L 24/81; H01L 24/92; H01L 2924/181; H01L 2224/83; H01L 2224/81; H01L 2224/13082; H01L 2224/32145; H01L 24/17
USPC .......................................... 257/737; 438/613
See application file for complete search history.

(56) References Cited

U.S. PATENT DOCUMENTS

| | | | |
|---|---|---|---|
| 10,134,677 B1 * | 11/2018 | Chang Chien | ........ H01L 21/486 |
| 2012/0012990 A1 * | 1/2012 | Pagaila | .................... H01L 24/92 |
| | | | 257/659 |
| 2016/0133601 A1 * | 5/2016 | Ko | .......................... H01L 24/97 |
| | | | 257/738 |
| 2019/0341368 A1 * | 11/2019 | Hu | .......................... H01L 24/14 |
| 2020/0203282 A1 * | 6/2020 | Shih | .................... H01L 21/4857 |

* cited by examiner

*Primary Examiner* — Didarul A Mazumder
(74) *Attorney, Agent, or Firm* — Kelly & Kelley, LLP (57) ABSTRACT

An electronic package is provided, which stacks an electronic structure as an integrated voltage regulator on an electronic component to facilitate close-range cooperation with the electronic component for electrical transmission.

8 Claims, 6 Drawing Sheets

ELECTRONIC PACKAGE INCLUDING ELECTRONIC STRUCTURE AND ELECTRONIC COMPONENT

BACKGROUND

1. Technical Field

The present disclosure relates to a semiconductor device, and more particularly, to an electronic package and a manufacturing method of the electronic package.

2. Description of Related Art

With the rapid development in electronic industry, electronic products are trending towards multiple functions and high performance. For instance, integrated voltage regulators (IVRs) have been embedded into high-performance processors to improve efficiency (e.g., the on/off frequency) and reduce power consumption, and also to increase reliability or even reduce manufacturing cost. Meanwhile, techniques currently used in the field of chip packaging include flip-chip packaging modules, such as Chip Scale Package (CSP), Direct Chip Attached (DCA) or Multi-Chip Module (MCM), or chip stacking techniques involving stacking chips one on top of another to thus form a three-dimensional (3D) integrated circuit (IC) stack.

Figure 1:
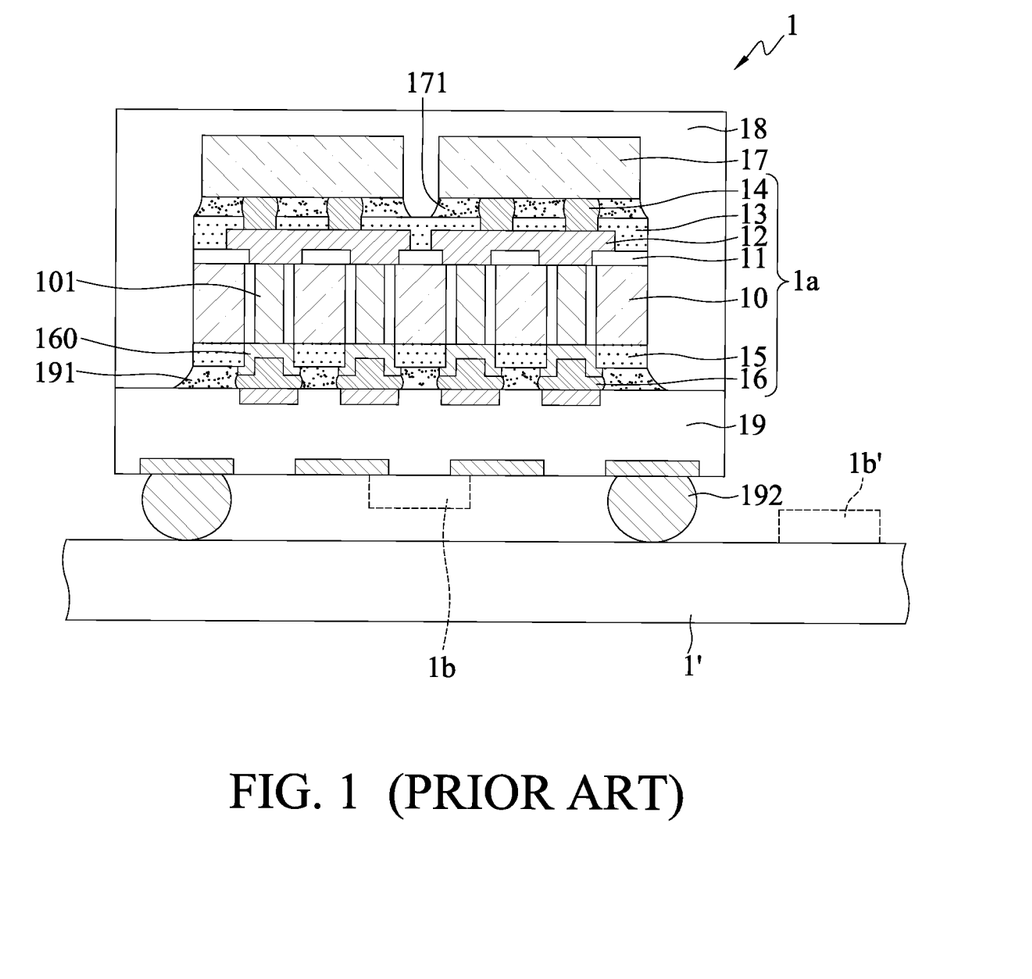
FIG. 1 is a schematic cross-sectional view of a conventional package structure.

FIG. 1 is a schematic cross-sectional view of the package structure 1 of a conventional 3D IC stack. As shown in FIG. 1, the package structure 1 includes a through silicon interposer (TSI) 1a, which has a silicon body 10 and a plurality of through-silicon vias (TSVs) 101 formed therein. A redistribution layer (RDL) is formed on a surface of the silicon body 10 and electrically connected with the TSVs 101. More specifically, the RDL includes a dielectric layer 11 and a circuit layer 12 formed on the dielectric layer 11, and the circuit layer 12 is electrically connected with the TSVs 101. An insulating protective layer 13 is formed on the dielectric layer 11 and the circuit layer 12, and portions of the circuit layer 12 are exposed from the insulating protective layer 13 and bonded to a plurality of solder bumps 14.

In addition, another insulating protective layer 15 can first be formed on the silicon body 10, and ends of the TSVs 101 are exposed from the insulating protective layer 15, such that a plurality of solder bumps 16 can be bonded to the ends of the TSVs 101. The solder bumps 16 are electrically connected with the TSVs 101. Moreover, an under bump metallurgy (UBM) layer 160 can be optionally formed on the ends of the TSVs 101 for attachment to the solder bumps 16.

Furthermore, the package structure 1 further includes a package substrate 19 for disposing the TSI 1a thereon via the solder bumps 16, such that the package substrate 19 can be electrically connected with the TSVs 101. The solder bumps 16 are encapsulated by an underfill 191.

In addition, the package structure 1 further includes a plurality of System-On-Chip (SOC) semiconductor chips 17 that are disposed on the solder bumps 14, so that the semiconductor chips 17 are electrically connected with the circuit layer 12. The solder bumps 14 are encapsulated by an underfill 171. An encapsulant 18 is further formed on the package substrate 19, such that the semiconductor chips 17 and the TSI 1a are encapsulated by the encapsulant 18.

In a subsequent application, the package structure 1 can be formed with a plurality of solder balls 192 on the lower side of the package substrate 19 to be attached onto a circuit board 1'.

In some early commercialized products, an integrated voltage regulator (IVR) 1b' is directly provided on the circuit board, but this approach means that the size of the end product cannot meet the requirements for light, thin and compact products. In addition, the distance between the IVR 1b' and the package structure 1 is too great, resulting in long transmission paths for signals between the IVR and the semiconductor chip 17 to which the IVR is electrically connected, thus degrading the electrical functions and increasing the power consumption.

In view of this, the IVR 1b is integrated to the lower side of the package substrate 19 to shorten the transmission distance between the IVR 1b and the semiconductor chip 17 and reduce the surface area and size of the circuit board 1'.

However, driven by the consumer demands, end products today are required to offer more functions, this increases the amount of semiconductor chips 17 that needs to be attached on the package substrate 19 as well as the amount of IVRs 1b that work in cooperation with them. As a result, there is not enough room on the lower side of the package substrate 19 for more IVRs 1b, and it is difficult for a single package structure 1 to satisfy the demands for light, thin and compact end products with low power consumption and high electrical performance at the same time.

Moreover, although it is possible to integrate the IVR 1b into the semiconductor chip 17, but the package structure 1 would need to be re-design. This would not only increase the cost of manufacturing, but would also require expansion to the size of the semiconductor chip 17. As a result, the demand for miniaturization cannot be met.

Therefore, there is a need for a solution that addresses the aforementioned issues in the prior art.

SUMMARY

In view of the aforementioned shortcomings of the prior art, the present disclosure provides an electronic package, which may include: an electronic structure including an electronic body with a first side and a second side opposite to each other, one or more conductors being formed on the first side of the electronic body; an electronic component combined with the conductors of the electronic structure; one or more conductive pillars disposed on the electronic component, wherein the electronic component is electrically connected with the conductive pillars and the conductors; and an encapsulating layer formed on the electronic component and encapsulating the electronic structure and the conductive pillars.

The present disclosure further provides a manufacturing method of an electronic package, which may include: providing an electronic body with a first side and a second side opposite to each other; forming one or more conductors on the first side of the electronic body to form an electronic structure; disposing the electronic structure on an electronic component via the conductors, with a plurality of conductive pillars being formed on the electronic component, wherein the electronic component is electrically connected with the conductive pillars and the conductors; and forming an encapsulating layer on the electronic component to encapsulate the electronic structure and the conductive pillars.

In the electronic package and manufacturing method thereof above, the electronic body may include a base and a circuit portion formed on the base, such that the base defines the second side and the circuit portion defines the first side, wherein the base includes a plurality of conductive vias electrically connected with the circuit portion and exposed from the second side. For instance, the conductors may be formed on the second side of the electronic body, and an insulating layer may be formed on the second side of the electronic body to encapsulate the conductors on the second side.

In the electronic package and manufacturing method thereof above, a surface of the encapsulating layer may be flush with ends of the conductive pillars.

In the electronic package and manufacturing method thereof above, ends of the conductive pillars may be exposed from a surface of the encapsulating layer.

In the electronic package and manufacturing method thereof above, the conductors may be electrically connected with the electronic component via conductive bumps.

The electronic package and manufacturing method thereof above may further include forming a plurality of conductive components on the encapsulating layer, wherein the plurality of conductive components are electrically connected with the conductive pillars.

The electronic package and manufacturing method thereof above may further include forming a circuit structure on the encapsulating layer, wherein the circuit structure is electrically connected with the conductive pillars. For instance, the electronic package and manufacturing method thereof above may further include a plurality of conductive components formed on the circuit structure, wherein the plurality of conductive components are electrically connected with the circuit structure. Also, the circuit structure may be in a fan-in or fan-out arrangement.

In summary of the above, the electronic package and the manufacturing method of the same in accordance with the present disclosure allow the electronic structure to be stacked on the electronic component, so that the electronic structure can be used in cooperation with the electronic component at a close range. Therefore, compared to the prior art, the present disclosure requires no redesigning of the electronic packages, thereby greatly reducing the manufacturing cost. Also, since there is no need to expand the size of the electronic component, the demand for miniaturization can be satisfied, and high electrical performance can be achieved.

BRIEF DESCRIPTION OF THE DRAWINGS

FIG. 2G' is a schematic cross-sectional view of another embodiment corresponding to FIG. 2G.

DETAILED DESCRIPTION

The ways in which the present disclosure can be implemented are illustrated in the following embodiments. One of ordinary skill in the art can readily appreciate other advantages and technical effects of the present disclosure based on the disclosed contents herein.

It should be noted that the structures, ratios, sizes shown in the appended drawings are to be construed in conjunction with the disclosures herein in order to facilitate understanding of those skilled in the art. They are not meant, in any way, to limit the implementations of the present disclosure, and therefore contain no substantial technical meaning. Without influencing the effects created and the objectives achieved by the present disclosure, any modifications, changes or adjustments to the structures, ratios or sizes should fall within the scope encompassed by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical contents, are also to be construed as within the scope of the present disclosure.

FIGS. 2A to 2G are schematic cross-sectional diagrams illustrating a method for manufacturing an electronic package 2 in accordance with a first embodiment of the present disclosure.

Figure 2A:
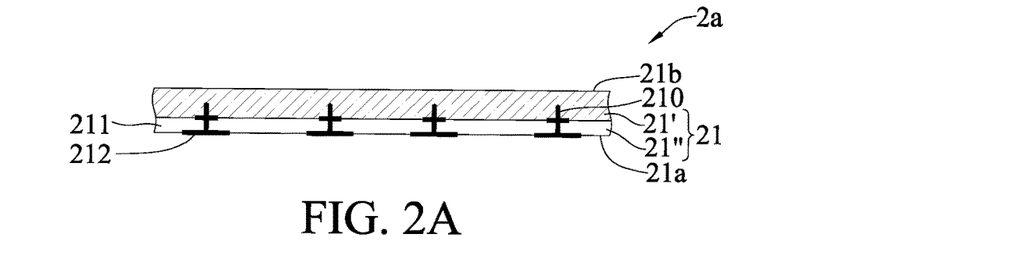
FIGS. 2A to 2G are schematic cross-sectional views illustrating a method for manufacturing an electronic package in accordance with a first embodiment of the present disclosure.

As shown in FIG. 2A, a panel-form wafer body 2a is provided, which includes a plurality of electronic bodies 21 arranged in an array, and each electronic body 21 includes a first side 21a and a second side 21b opposite to each other.

In an embodiment, the electronic body 21 is an active component, such as a semiconductor chip, including a silicon base 21' and a circuit portion 21" formed on the base 21'. The base 21' includes a plurality of conductive vias 210, such as through silicon vias (TSVs), exposed from the base 21' for electrically connecting with the circuit portion 21". For instance, the circuit portion 21" includes a passivation layer 211 and a circuit layer 212 combined with the passivation layer 211, and the circuit layer 212 is electrically connected with the conductive vias 210. More specifically, the base 21' defines the second side 21b, while the circuit portion 21" defines the first side 21a. It can be appreciated that there are numerous types of structures for the active component that includes the conductive vias 210, and the present disclosure is not limited to the above.

Figure 2B:
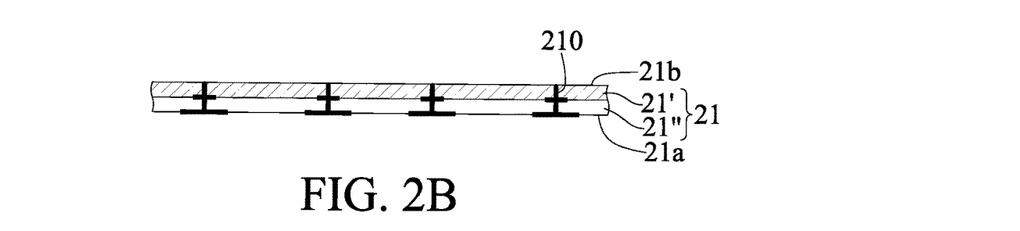

As shown in FIG. 2B, a thinning process, such as polishing, is performed to remove portions of the second side 21b (or the base 21') of the electronic body 21, so that the conductive vias 210 are exposed from the second side 21b.

Figure 2C:
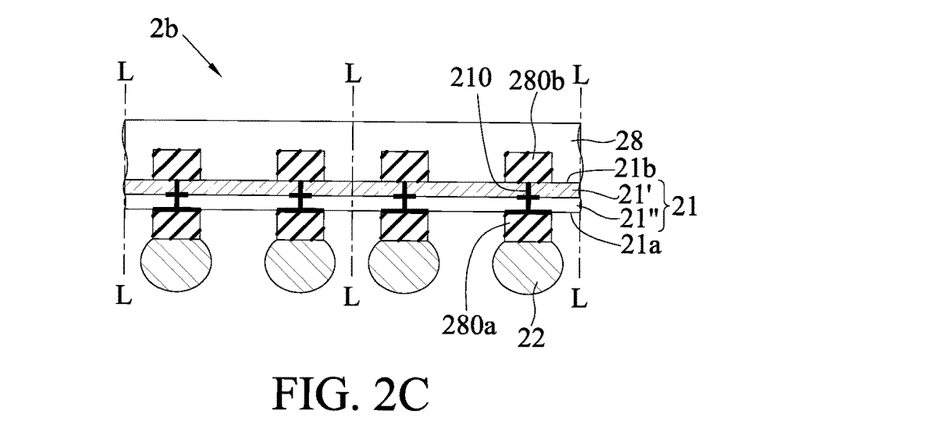

As shown in FIG. 2C, a plurality of first conductors 280a and a plurality of second conductors 280b are formed on the first side 21a and the second side 21b of the electronic body 21, respectively, such that the first conductors 280a and the second conductors 280b are electrically connected with the circuit layer 212 and the conductive vias 210, respectively.

In an embodiment, the exposed two ends of each of the conductive vias 210 are in contact with a first conductor 280a and a second conductor 280b, respectively. The first conductors 280a and the second conductors 280b are, for example, metal (e.g., copper) pillars.

In addition, an insulating layer 28 is formed on the second side 21b of the electronic body 21, such that the insulating layer 28 encapsulates the second conductors 280b. For instance, the second conductors 280b are not exposed from the insulating layer 28. The plurality of first conductors 280a are bonded with a plurality of conductive bumps 22. More specifically, the conductive bumps 22 are metal bumps, such as copper pillars, solder balls, etc.

Furthermore, a singulation process is performed along cutting paths L to obtain a plurality of electronic structures 2b to be used as integrated voltage regulators (IVRs).

Figure 2D:
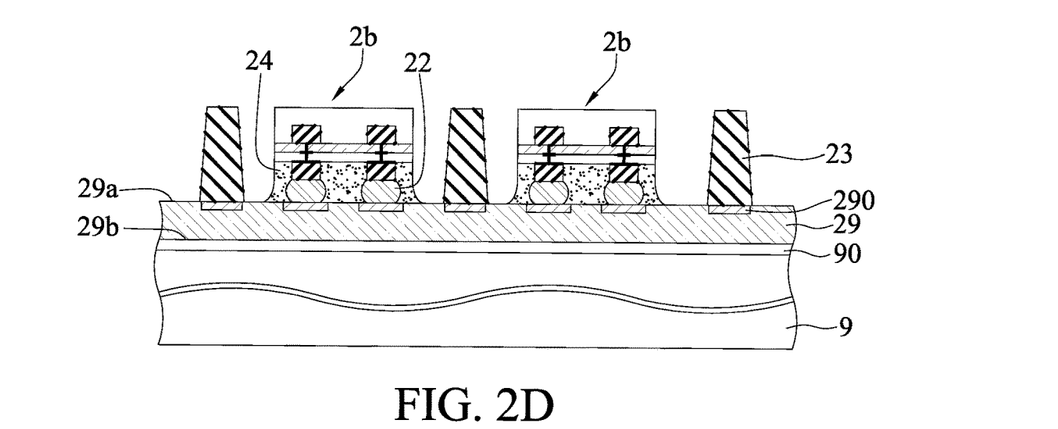

As shown in FIG. 2D, an electronic component 29 disposed on a carrier board 9 is provided, and a plurality of conductive pillars 23 are formed on the electronic component 29. At least one electronic structure 2b is disposed on the electronic component 29.

In an embodiment, the electronic component 29 is an active component, a passive component or a combination of both, wherein the active component can be, for example, a semiconductor chip, and the passive component can be, for example, a resistor, a capacitor, or an inductor. For instance, the electronic component 29 is a semiconductor chip, such as a System-On-Chip (SOC) functional chip with an active face 29a and a non-active face 29b opposite to each other. A plurality of electrode pads 290 are provided on the active face 29a. The electronic component 29 is disposed on the carrier board 9 via the non-active face 29b.

Moreover, the carrier board 9 can be, for example, a semiconductor (e.g., silicon or glass) board. Depending on the needs, a release layer 90 (or an adhesive layer) can be formed on the carrier board 9, such that the electronic component 29 can be disposed on the release layer 90.

In addition, the conductive pillars 23 are provided on some of the electrode pads 290 of the electronic component 29 and electrically connected with these electrode pads 290. The conductive pillars 23 can be made of, for example, a metal (e.g., copper) or a solder material.

Also, the electronic structure 2b is attached to the other electrode pads 290 of the electronic component 29 via the plurality of conductive bumps 22 and electrically connected with these electrode pads 290. The conductive bumps 22 and the first conductors 280a can be encapsulated by, for example, a bonding layer 24 (e.g., an underfill) depending on the needs.

Figure 2E:
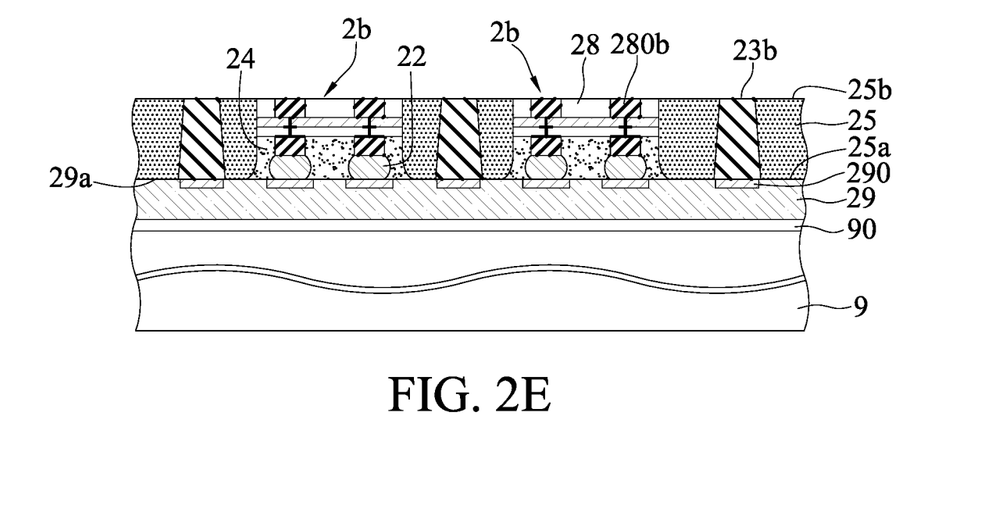

As shown in FIG. 2E, an encapsulating layer 25 is formed on the active face 29a of the electronic component 29, such that the electronic structures 2b, the bonding layer 24, and the conductive pillars 23 are encapsulated by the encapsulating layer 25, wherein the encapsulating layer 25 includes a first surface 25a and a second surface 25b opposite to each other, and the encapsulating layer 25 is combined to the active face 29a of the electronic component 29 via the first surface 25a. Next, a planarization process is performed, such that the second surface 25b of the encapsulating layer 25 is flush with the ends 23b of the conductive pillars 23 and the insulating layers 28 (or the ends of the second conductors 280b) of the electronic structures 2b, and that the ends 23b of the conductive pillars 23 and the insulating layers 28 (or the ends of the second conductors 280b) of the electronic structures 2b are exposed from the second surface 25b of the encapsulating layer 25.

In an embodiment, the encapsulating layer 25 is an insulating material, such as an epoxy resin, that can be formed on the electronic component 29 through lamination or molding.

Moreover, the planarization process includes removing a portion of the conductive pillars 23, a portion of the insulating layers 28 (or the second conductors 280b) of the electronic structures 2b, and a portion of the encapsulating layer 25 by polishing.

Furthermore, if the bonding layer 24 is not present, then the encapsulating layer 25 can encapsulate the conductive bumps 22 and the first conductors 280a.

Figure 2F:
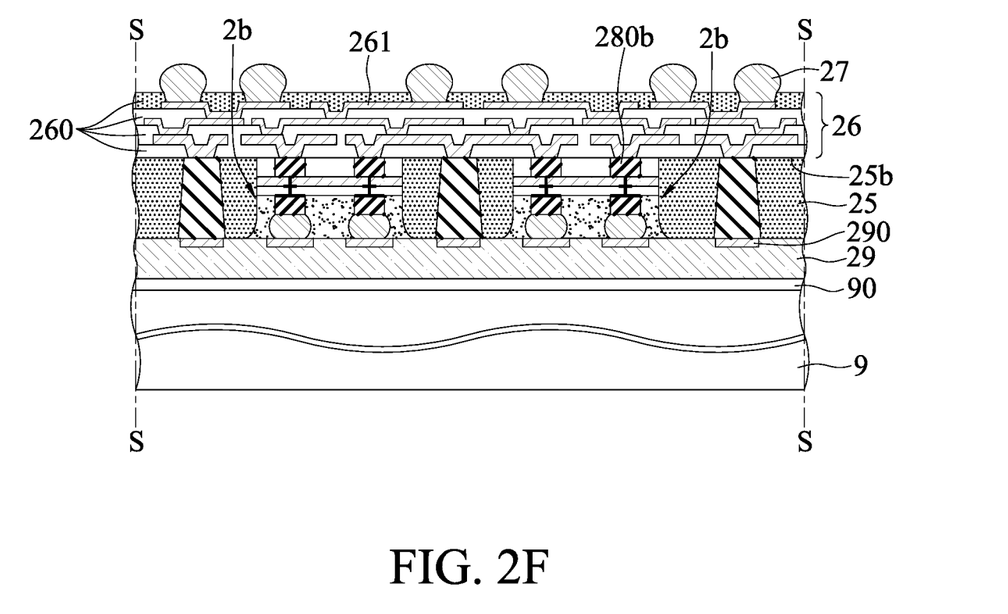

As shown in FIG. 2F, a circuit structure 26 is formed on the second surface 25b of the encapsulating layer 25, and the circuit structure 26 is electrically connected with the conductive pillars 23 and the second conductors 280b of the electronic structures 2b.

In an embodiment, the circuit structure 26 includes a plurality of dielectric layers 260 and a plurality of RDLs 261 disposed on the dielectric layers 260. The outermost dielectric layer 260 can be used as a solder resist layer, and the outermost RDL 261 is partially exposed from the solder resist layer. Alternatively, the circuit structure 26 can include only a single dielectric layer 260 and a single RDL 261.

In addition, the RDLs 261 can be made of copper, while the dielectric layers 260 can be made of, for example, polybenzoxazole (PBO), polyimide (PI), a prepreg or other dielectric materials.

Moreover, a plurality of conductive components 27 (e.g., solder balls) are formed on the outermost RDL 261, such that the conductive components 27 are electrically connected with the conductive pillars 23 and/or the second conductors 280b. The circuit structure 26 is, for example, in a fan-in arrangement, so that the layout of the conductive components 27 does not exceed the area of the active face 29a of the electronic component 29.

Figure 2G:
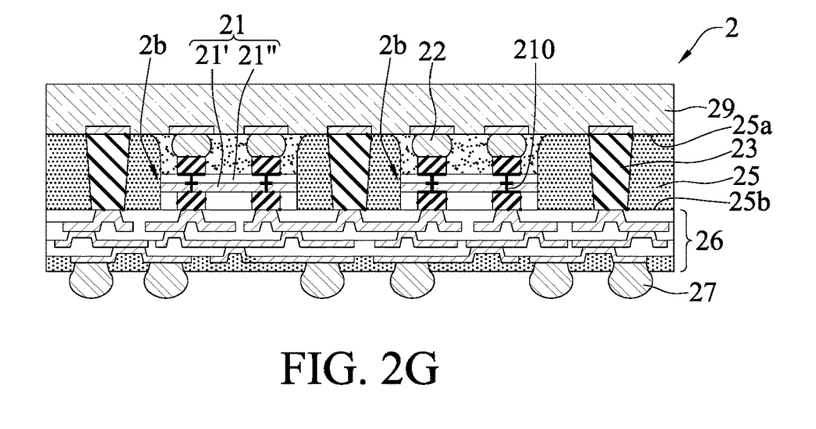

As shown in FIG. 2G, the carrier board 9 and the release layer 90 thereon are removed to expose the electronic component 29. A singulation process is performed along cutting paths S shown in FIG. 2F to obtain the electronic package 2.

Figure 2H:
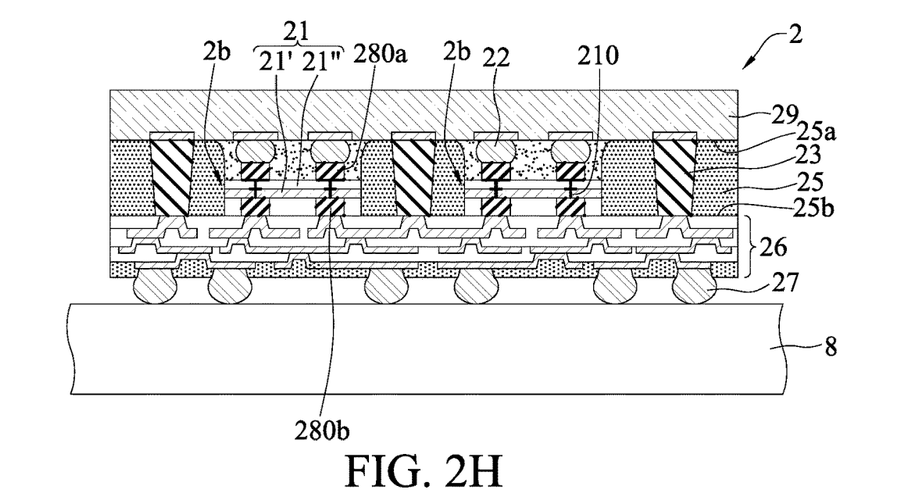
FIG. 2H is a schematic cross-sectional view illustrating a process subsequent to FIG. 2G.

In an embodiment, as shown in FIG. 2H, in a subsequent process, the electronic package 2 can be attached to an upper side of a wiring board 8 via the conductive components 27. The wiring board 8 can be an organic board (e.g., a substrate with a core layer and a circuit portion or a coreless substrate with a circuit portion) or an inorganic board (e.g., a silicon board). The lower side of the wiring board 8 can be further attached to an electronic device (not shown), such as a circuit board.

Furthermore, in another embodiment, as shown in FIG. 2G', an electronic package 2' is manufactured without the circuit structure 26 as needed. For instance, the conductive components 27 are attached onto the second conductors 280b of the electronic structures 2b and the conductive pillars 23 and electrically connected with the second conductors 280b and the conductive pillars 23. More specifically, the conductive components 27 are bonded onto the second conductors 280b and the conductive pillars 23 via metal pillars 270, such as copper pillars.

Therefore, with the manufacturing method of the present disclosure, the electronic structure 2b used as the IVR can be stacked on the electronic component 29, so that it can be used in cooperation with electronic component 29 of different functions. Thus, compared to the prior art in which IVR is integrated in a SOC, the manufacturing method of the present disclosure requires no re-designing of the electronic package 2, 2'. As a result, manufacturing cost can be significantly reduced, and since there is no need to expand the size of the electronic component 29, miniaturization can be attained.

Moreover, compared to the prior art in which the IVR is integrated onto a circuit board or a package substrate, the electrical transmission distance between the electronic structure 2b and the electronic component 29 of the present disclosure can be shortened (without the need to pass through a package substrate or a circuit board). This reduces loss as well as the size of the electronic package 2, 2' while improving the electrical performance.

FIGS. 3A to 3F are schematic cross-sectional diagrams illustrating a method for manufacturing an electronic package 3 in accordance with a second embodiment of the present disclosure. This embodiment is different from the first embodiment in the configuration of the electronic structure 3b, while the remaining processes are generally similar, and thus they will not be repeated for conciseness.

Figure 3A:
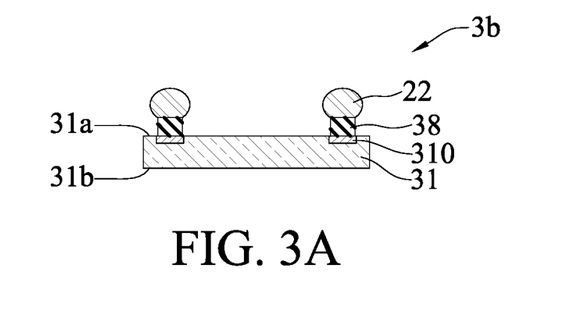
FIGS. 3A and 3F are schematic cross-sectional views illustrating a method for manufacturing an electronic package in accordance with a second embodiment of the present disclosure.

As shown in FIG. 3A, an electronic structure 3b is provided, which includes a plurality of conductors 38 for combining with conductive bumps 22. The electronic structure 3b is to be used as an integrated voltage regulator (IVR).

In an embodiment, the electronic structure 3b is an active component, such as a semiconductor chip. The electronic body 31 includes a first side 31a and a second side 31b opposite to each other. A plurality of electrode pads 310 are provided on the first side 31a for combining with the conductors 38. The electronic body 31 is not formed with the TSVs 210.

Figure 3B:
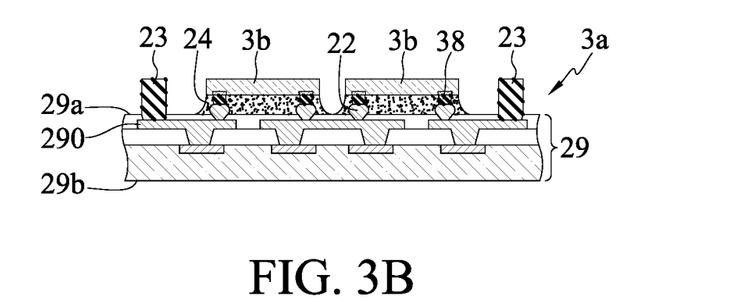

As shown in FIG. 3B, at least one electronic structure 3b is provided on an electronic component 29 via the conductive bumps 22 to form a stacked assembly 3a. A plurality of conductive pillars 23 are formed on the electronic component 29. Thereafter, singulation process is performed to obtain a plurality of stacked assemblies 3a.

In an embodiment, the electronic structure 3b is attached and electrically connected to some of electrode pads 290 of the electronic component 29 via the plurality of conductive bumps 22 in a flip-chip arrangement. In an example, a bonding layer 24 (e.g., an underfill) is used to encapsulate the conductive bumps 22 and the conductors 38 depending on the needs.

Figure 3C:
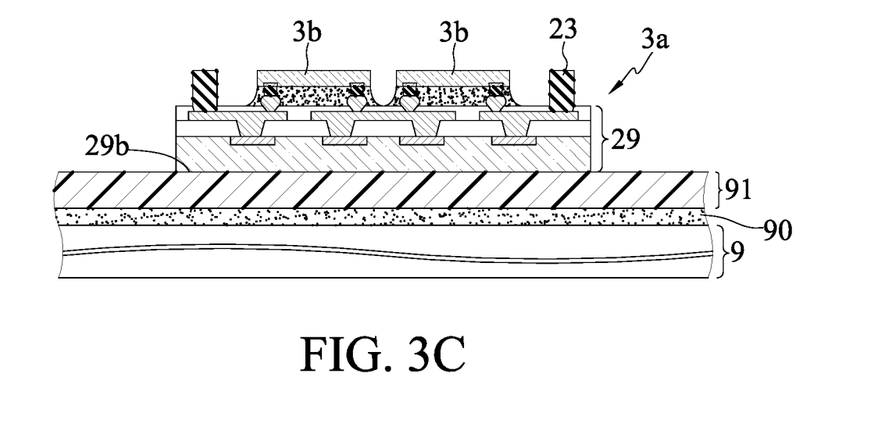

As shown in FIG. 3C, the stacked assembly 3a is provided on a carrier board 9 via the non-active face 29b of the electronic component 29.

In an embodiment, the carrier board 9 can be, for example, a semiconductor (e.g., silicon or glass) board. Depending on the needs, a release layer 90 and an adhesive layer 91 can be formed on the carrier board 9, such that the electronic component 29 can be disposed on the adhesive layer 91.

Figure 3D:
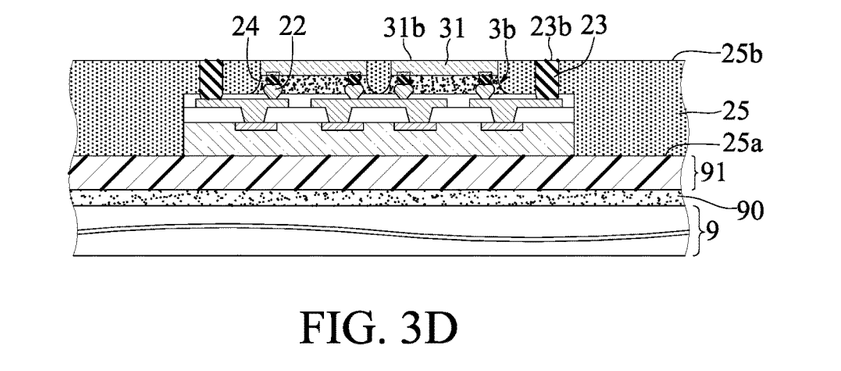

As shown in FIG. 3D, an encapsulating layer 25 is formed on the adhesive layer 91 of the carrier board 9, so the stacked assembly 3a is encapsulated by the encapsulating layer 25. The encapsulating layer 25 includes a first surface 25a and a second surface 25b opposite to each other, and is bonded to the adhesive layer 91 via the first surface 25a. Then, a planarization process is performed to make the second surface 25b of the encapsulating layer 25 flush with the ends 23b of the conductive pillars 23 and the second sides 31b of the electronic bodies 31 of the electronic structures 3b, such that the ends 23b of the conductive pillars 23 are exposed from the second surface 25b of the encapsulating layer 25.

In an embodiment, the encapsulating layer 25 is an insulating material, such as an epoxy resin, that can be formed on the adhesive layer 91 through lamination or molding.

Moreover, the planarization process includes removing a portion of the conductive pillars 23 and a portion of the encapsulating layer 25 (or even portions of the electronic bodies 31) by polishing.

Figure 3E:
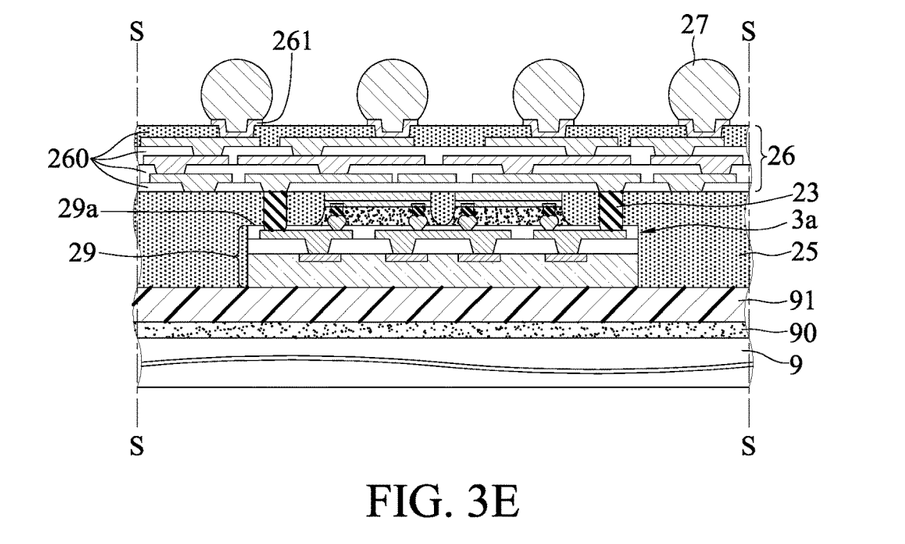

As shown in FIG. 3E, a circuit structure 26 is formed on the encapsulating layer 25, and the circuit structure 26 is electrically connected with the conductive pillars 23. A plurality of conductive components 27 (e.g., solder balls) are formed on an outermost RDL 261, and the plurality of conductive components 27 are electrically connected with the RDL 261.

In an embodiment, the circuit structure 26 is in a fan-out arrangement, so that the layout of the conductive components 27 exceeds the area of the active face 29a of the electronic component 29.

Figure 3F:
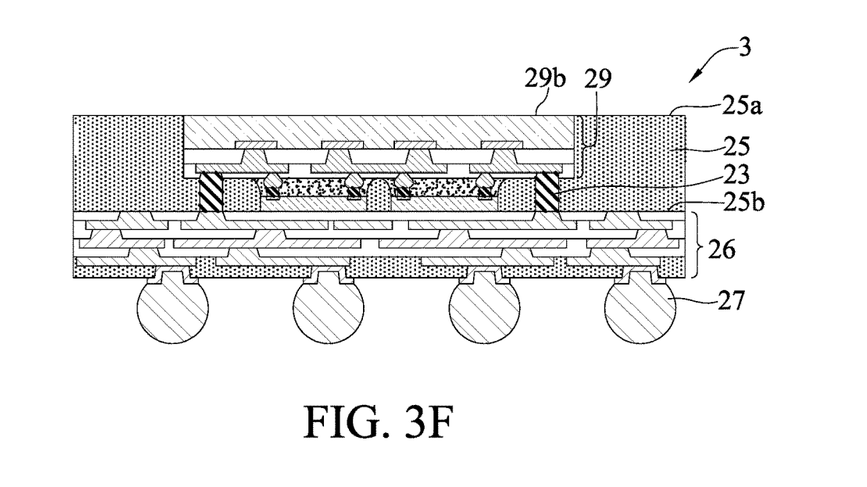

As shown in FIG. 3F, the carrier board 9 and the release layer 90 and the adhesive layer 91 thereon are removed to expose the non-active face 29b of the electronic component 29. Next, a singulation process is performed along cutting paths S shown in FIG. 3E to obtain the electronic package 3 of the present disclosure. The electronic package 3 can be further attached to an electronic device (not shown) that is a package structure or other structure (e.g., a circuit board or an interposer) in subsequent processes via the conductive components 27.

Therefore, with the manufacturing method of the present disclosure, the electronic structure 3b used as the IVR is stacked on the electronic component 29 to facilitate the cooperation with electronic components 29 of different functions. Therefore, compared to the prior art in which IVR is integrated in a SOC, the manufacturing method of the present disclosure requires no re-designing of the electronic packages 3. As a result, manufacturing cost can be significantly reduced, and since there is no need to expand the size of the electronic component 29, miniaturization can be achieved.

Moreover, compared to the prior art in which the IVR is integrated onto a circuit board or a package substrate, the electrical transmission distance between the electronic structure 3b and the electronic component 29 of the present disclosure can be shortened (without the need to pass through a package substrate or a circuit board). This reduces loss and the size of the electronic package 3 while improving the electrical performance.

The present disclosure further provides an electronic package 2, 2', 3, which includes an electronic structure 2b, 3b, an electronic component 29, a plurality of conductive pillars 23 and an encapsulating layer 25.

The electronic structure 2b, 3b includes an electronic body 21, 31 with a first side 21a, 31a and a second side 21b, 31b opposite to each other. A plurality of first conductors 280a (or conductors 38) are formed on the first side 21a, 31a of the electronic body 21, 31.

The electronic component 29 is combined with the first conductors 280a (or the conductors 38) of the electronic structure 2b, 3b.

The conductive pillars 23 are disposed on the electronic component 29, such that the electronic component 29 is electrically connected with the conductive pillars 23 and the first conductors 280a or conductors 38.

The encapsulating layer 25 is formed on the electronic component 29 for encapsulating the electronic structure 2b, 3b and the conductive pillars 23.

In an embodiment, the electronic body 21 includes a base 21' and a circuit portion 21" formed on the base 21', such that the base 21' defines the second side 21b, and the circuit portion 21" defines the first side 21a, and the base 21' includes a plurality of conductive vias 210 electrically connected with the circuit portion 21" and exposed from the second side 21b. For instance, second conductors 280b are further formed on the second side 21b of the electronic body 21, and an insulating layer 28 is formed on the second side 21b of the electronic body 21 for encapsulating the second conductors 280b.

In an embodiment, the second surface 25b of the encapsulating layer 25 is flush with the ends 23b of the conductive pillars 23.

In an embodiment, the ends 23b of the conductive pillars 23 are exposed from the second surface 25b of the encapsulating layer 25.

In an embodiment, the first conductors 280a (or the conductors 38) are electrically connected with the electronic component 29 via conductive bumps 22.

In an embodiment, the electronic package 2' further includes a plurality of conductive components 27 formed on the encapsulating layer 25, such that the conductive components 27 are electrically connected with the conductive pillars 23.

In an embodiment, the electronic package 2, 3 further includes a circuit structure 26 formed on the encapsulating layer 25, such that the circuit structure 26 is electrically connected with the conductive pillars 23. Furthermore, the electronic package 2, 3 further includes a plurality of conductive components 27 formed on the circuit structure 26, such that the plurality of conductive components 27 are electrically connected with the circuit structure 26. For example, the circuit structure 26 can be in a fan-in or fan-out arrangement.

In conclusion, the electronic package and the manufacturing method of the same in accordance with the present disclosure allows the electronic structure to be stacked on the electronic component, so as to be used in cooperation with the electronic component at close range. Therefore, the present disclosure requires no redesigning of the electronic packages, and the manufacturing cost can be substantially reduced. Also, there is no need to expand the size of the electronic component, the demand for miniaturization can be satisfied and high electrical performance can be achieved.

Furthermore, by embedding the electronic structure used as an IVR in the encapsulating layer, the electronic package is suitable for servers or base station processors.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
   an electronic structure including an electronic body with a first side and a second side opposite to each other, wherein the electronic body includes a plurality of conductive vias and a circuit portion including a circuit layer;
   one or more first conductors formed on the first side of the electronic body and electrically connected with the circuit layer;
   one or more second conductors formed on the second side of the electronic body and electrically connected with the plurality of conductive vias;
   a bonding layer formed on the first side of the electronic body and encapsulating the one or more first conductors; and
   an insulating layer formed on the second side of the electronic body and encapsulating the one or more second conductors;
   an electronic component combined with the one or more first conductors of the electronic structure, wherein the electronic component has an active surface and a non-active surface opposite to each other, and a plurality of electrode pads are provided on the active surface, such that the electronic structure is attached to a portion of the plurality of electrode pads of the electronic component via the one or more first conductors;
   one or more conductive pillars disposed on and electrically connected with another portion of the plurality of electrode pads of the electronic component, wherein the electronic component is electrically connected with the one or more conductive pillars and the one or more first conductors; and
   an encapsulating layer formed on the active surface of the electronic component and encapsulating the electronic structure and the one or more conductive pillars, wherein the encapsulating layer is in contact with the active surface of the electronic component and free from being in contact with other surfaces of the electronic component, such that the other surfaces of the electronic component are appearance surfaces of the electronic package, and any insulating material is free from being in contact with the other surfaces of the electronic component.

2. The electronic package of claim 1, wherein the electronic body includes a base and the circuit portion is formed on the base, with the base defining the second side and the circuit portion defining the first side, and wherein the base includes the conductive vias electrically connected with the circuit portion and exposed from the second side.

3. The electronic package of claim 1, wherein a surface of the encapsulating layer is flush with ends of the one or more conductive pillars.

4. The electronic package of claim 1, wherein ends of the one or more conductive pillars are exposed from a surface of the encapsulating layer.

5. The electronic package of claim 1, wherein the one or more first conductors are electrically connected with the portion of the plurality of electrode pads of the electronic component via conductive bumps.

6. The electronic package of claim 1, further comprising a circuit structure formed on the encapsulating layer, wherein the circuit structure is electrically connected with the one or more conductive pillars.

7. The electronic package of claim 6, further comprising a plurality of conductive components formed on the circuit structure, wherein the plurality of conductive components are electrically connected with the circuit structure.

8. The electronic package of claim 6, wherein the circuit structure is in a fan-in or fan-out arrangement.

* * * * *